US009001955B2

(12) United States Patent
Lamanna et al.

(10) Patent No.: US 9,001,955 B2
(45) Date of Patent: Apr. 7, 2015

(54) PHASE-LOCKED LOOP MODULATION

(71) Applicant: Cambridge Silicon Radio Limited, Cambridge (GB)

(72) Inventors: Pasquale Lamanna, Villeneuve-Loubet (FR); Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 14/057,623

(22) Filed: Oct. 18, 2013

(65) Prior Publication Data

US 2014/0050289 A1     Feb. 20, 2014

Related U.S. Application Data

(62) Division of application No. 12/934,617, filed as application No. PCT/EP2009/052963 on Mar. 13, 2009, now Pat. No. 8,588,329.

(30) Foreign Application Priority Data

Mar. 31, 2008    (GB) .................................. 0805812.5

(51) Int. Cl.
  *H03D 3/24*     (2006.01)
  *H04L 7/033*    (2006.01)
  *H03L 7/197*    (2006.01)
  *H03L 7/08*     (2006.01)

(52) U.S. Cl.
  CPC ............ *H04L 7/0331* (2013.01); *H03L 7/1976* (2013.01); *H03L 7/08* (2013.01)

(58) Field of Classification Search
  CPC ..... H04L 7/033; H04L 27/2272; H03L 7/235; H03L 2207/06; H03C 3/0975; H03J 5/0272; H03J 7/065; H03J 7/285

USPC .......................................................... 375/376
See application file for complete search history.

(56) References Cited

U.S. PATENT DOCUMENTS

| 4,158,200 | A | * | 6/1979  | Seitz et al. ..................... 345/589 |
| 4,965,531 | A | * | 10/1990 | Riley ............................. 331/1 A |
| 5,256,980 | A | * | 10/1993 | Itri ................................. 327/105 |

(Continued)

OTHER PUBLICATIONS

US 6,151,553, 02/2003, Filiol et al. (withdrawn).

*Primary Examiner* — Lihong Yu
(74) *Attorney, Agent, or Firm* — Vorys, Sater, Seymour and Pease LLP; Vincent M DeLuca

(57) ABSTRACT

A phase-locked loop having: an oscillator for forming an oscillating output signal; a frequency divider connected to receive the output of the oscillator and frequency divide it by a value dependent on a division control signal; and a phase comparator for comparing the phase of the divided signal and a reference signal to generate a control signal, the operation of the oscillator being dependent on the control signal; a first mode of operation in which the frequency divider is configured to operate in dependence on a first division control signal such that the resultant oscillating output signal has a first frequency and first phase, a second mode of operation in which the frequency divider is configured to operate in dependence on a second division control signal such that the resultant oscillating output signal has a second frequency and second phase, the first division control signal being generated independently of the oscillating output signal such that the first phase is maintained when the phase-locked loop is operating in a second mode.

20 Claims, 2 Drawing Sheets

(56) References Cited

U.S. PATENT DOCUMENTS

| | | | |
|---|---|---|---|
| 5,369,779 A * | 11/1994 | Moreland | 725/73 |
| 7,486,145 B2 * | 2/2009 | Floyd et al. | 331/1 A |
| 7,567,644 B2 | 7/2009 | Wagner | |
| 2003/0162518 A1 * | 8/2003 | Baldwin et al. | 455/253.2 |
| 2004/0228430 A1 | 11/2004 | Moy et al. | |
| 2005/0041755 A1 | 2/2005 | Hammes | |
| 2005/0080564 A1 | 4/2005 | Tso et al. | |
| 2006/0046663 A1 | 3/2006 | Yu | |
| 2007/0040940 A1 | 2/2007 | Wang et al. | |
| 2007/0252737 A1 * | 11/2007 | Eikenbroek | 341/143 |

\* cited by examiner

PHASE-LOCKED LOOP MODULATION

This invention relates to modulating phase-locked loops (PLLs), and especially to techniques suitable for modulating PLLs to allow accurate switching between different modes of operation.

Increasing numbers of functions are being combined into electronic devices. For instance, radio receivers that are capable of receiving signals of more than one protocol are becoming increasingly desirable. An example of such a multi-protocol receiver is one that is capable of receiving Bluetooth and GPS (Global Positioning System) signals. This combination is very convenient because in a typical pattern of Bluetooth usage the Bluetooth radio is active intermittently for a total of around 10% of the time. The remainder of the time can be used for GPS reception and is normally sufficient to achieve a satisfactory positional fix.

FIG. 1 is a schematic diagram of a receiver for GPS signals. The signals are received at antenna 1, amplified by amplifier 2 and then mixed in mixer 3 with a signal from local oscillator 4. The mixing step downconverts the received signals and they can then be processed further by processing block 5, for example to perform C/A (coarse/acquisition) code correlation on the received signals.

As illustrated in FIG. 1, the local oscillator 4 can be implemented as a fractional-N PLL 6 that is clocked by a reference clock 7. The basic architecture of a fractional-N PLL is well-known. In essence it comprises a controllable oscillator 8 such as a VCO (voltage controlled oscillator), a division unit 9, a phase comparator 10 and a division ratio controller 11. The controllable oscillator 8 outputs an oscillating signal at a frequency that is dependent on the input it receives from the phase comparator 10. That output signal from the oscillator constitutes the local oscillator signal that is consumed by mixer 3. The output of the oscillator also stimulates a feedback loop that passes to the phase comparator 10. The output of the oscillator is frequency divided by divider 9. The output of the divider and the reference clock signal are the inputs to the phase comparator. In a fractional-N PLL the division ratio applied by the divider is not fixed. Instead the divider switches between two or more available division ratios, for example between 1:1/N and 1:1/N+1. This allows finer resolution in the output frequency than can be achieved in a PLL where the division ratio is fixed. The division ratio controller 11 controls which of the available division ratios is to be used. One conventional approach (as illustrated in FIG. 1) is to use a sigma-delta modulator for the division ratio controller so as to select the pattern of division ratios in such a way as to noise-shape the signal produced by the divider. The sigma-delta modulator is clocked from the feedback loop.

In a device that has GPS and Bluetooth capabilities another similar local oscillator, conveniently using the same reference clock, can be used to generate the local oscillator signal that is used for downconverting received Bluetooth signals. However, such oscillators can use a considerable amount of power and occupy circuit real-estate and so it is highly desirable to avoid duplicating oscillators.

If the device is going to receive GPS and Bluetooth alternately rather than simultaneously a single local oscillator could be used for reception of both signals, being switched between the desired frequencies and phases depending on which mode the device is operating in. If the device is to be able to switch modes rapidly, as would be required if it is to switch before and after each Bluetooth burst, it would have to lock rapidly on to each type of signal. To do this, when the receiver is operating in one mode it would have to retain the live state of the division ratio controller that is associated with the other mode. One approach is illustrated in FIG. 2, which is a schematic diagram of such a dual-mode PLL. Like elements are designated in FIG. 2 as they are in FIG. 1. Instead of a single sigma-delta modulator, the division ratio controller 11 of FIG. 2 has two sigma-delta modulators. One sigma-delta modulator 20 is configured to produce the codes necessary for controlling the PLL to produce a suitable output frequency for GPS operation. The other sigma-delta modulator 21 is configured to produce the codes necessary for controlling the PLL to produce a suitable output frequency for Bluetooth operation. Both sigma-delta modulators 20, 21 are clocked as normal from the feedback loop. A multiplexer 22 is arranged between the sigma-delta modulators and the divider. The multiplexer is signalled at 23 with an indication of which mode the receiver is to operate in. In dependence on that indication it selects the output of the appropriate one of the sigma-delta modulators and applies it to the divider. This circuit avoids redundant componentry and also allows the state of both sigma-delta modulators to be retained irrespective of which one is in use.

However, the fractional-N PLL circuit of FIG. 2 does not guarantee fast phase lock when switching between modes. When the circuit is operating in one mode, Bluetooth for example, the GPS sigma-delta modulator 20 will be clocked from the PLL loop. But the PLL loop is at that time running at a rate that is controlled by the Bluetooth sigma-delta modulator 21. As a result, when the device switches back to GPS the state of the GPS sigma-delta modulator 20 will be different than it would have been if the device had been operating continuously to receive GPS. That difference can manifest itself as a difference in phase between the output of the PLL as it is when the device switches back into GPS mode and the output of the PLL as it would have been if it had remained in GPS mode. That phase error can adversely affects reception of the GPS signals until the GPS correlators have re-acquired phase lock. The time taken to re-acquire phase lock eats into the time that is available to receive GPS signals between Bluetooth bursts or can even prevent lock in weak signal conditions, so this circuit makes it difficult to obtain a positional fix or track positional changes when only short periods are available for GPS reception. This lack of phase coherency between GPS slots also prevents coherent integration (correlation) of the GPS signal and prevents fix acquisition in weak signal conditions where long integration periods are required.

Another option might be to capture the state of the sigma-delta modulator when it is inactive and then to use that state as the initial state when that sigma-delta modulator is re-activated. However, in a fractional-N PLL that will not work because it will only return the PLL to the state in which it was some time previously, introducing an unknown error with respect to the currently-required state. It might be expected that if state of the PLL when it became inactive and the number of clock cycles during which the PLL was inactive were known then the currently-required state could be predicted, but that is not feasible because the progression of states of the sigma-delta modulator is essentially chaotic.

There is a need for a way to provide local oscillator signals, or oscillating signals for other purposes, that can switch between multiple modes without accumulating phase errors and without duplicating excessive components.

According to one aspect of the present invention there is provided a phase-locked loop having: an oscillator for forming an oscillating output signal; a frequency divider connected to receive the output of the oscillator and frequency divide it by a value dependent on a division control signal; and a phase comparator for comparing the phase of the divided signal and a reference signal to generate a control signal, the operation of the oscillator being dependent on the control signal; the output data to form a divided signal a division ratio controller configured to, when clocked by an input signal, generate a series of output data for forming the division control signal; the phase-locked loop having: a first mode of operation in which the frequency divider is operable to frequency divide the output of the oscillator by a value dependent on the output of the division ratio controller; and a second mode of operation in which the frequency divider is not operable to frequency divide the output of the oscillator by a value dependent on the output of the division ratio controller, and the division ratio controller is clocked by a signal that is independent of the output of the oscillator.

The phase-locked loop may be capable of switching from the first mode of operation to the second mode of operation. The phase-locked loop may be configured so that whilst it is operating in the second mode following such switching the division ratio controller maintains its state as if the phase-locked loop were operating in the first mode.

The division ratio controller may be clocked by a signal that is independent of the output of the oscillator in both modes. It may be clocked from a single reference oscillator in both modes.

The division ratio controller may be a sigma-delta modulator.

The frequency divider may be operable to frequency divide the output of the oscillator by the output of the division ratio controller. Alternatively, the frequency divider may be operable to frequency divide the output of the oscillator by the output of the division ratio controller plus a predetermined constant. The division ratio controller may be configured to output only integers. The division ratio controller may be configured to output only values from a set whose members that differ by two or less. The division ratio controller may be configured to output only the values −1, 0 and +1. The division ratio controller may be configured to output values in Gray coded form.

The phase-locked loop may comprise a sample-and-hold circuit arranged to store the most recent output of the division ratio controller. The frequency divider may be configured to frequency divide the output of the oscillator by the value stored by the sample-and-hold circuit when it comes to perform a division.

The phase-locked loop may comprise a second division ratio controller configured to, when clocked by an input signal, generate a series of output data for forming the division control signal. The phase-locked loop may then be arranged to, when operating in the second mode of operation frequency divide the output of the oscillator by a value dependent on the output of the second division ratio controller. The second division ratio controller may be clocked in either or both modes by a signal that is independent of the output of the oscillator.

The phase-locked loop may be a fractional N phase-locked loop.

According to a second aspect of the invention there is provided a signal receiver comprising: a phase-locked loop as set out above; and a downconverter for downconverting a received signal in dependence on the output of the oscillator.

The downconverter may comprise a mixer configured to mix a received signal with a signal whose frequency is dependent on the output of the oscillator. The receiver may have a first mode for receiving signals of a first protocol and a second mode for receiving signals of a second protocol, and may be arranged to control the phase-locked loop to operate in its first mode when the receiver is operating in its first mode and to control the phase-locked loop to operate in its second mode when the receiver is operating in its second mode. Alternatively, the receiver could not receive when in the second mode.

According to a third aspect of the present invention there is provided a signal transmitter comprising: a phase-locked loop as claimed in any of claims 1 to 13; and an upconverter for upconverting a signal for transmission in dependence on the output of the oscillator.

The upconverter may comprise a mixer configured to mix a signal for transmission with a signal whose frequency is dependent on the output of the oscillator. The transmitter may have a first mode for transmitting signals of a first protocol and a second mode for transmitting signals of a second protocol, and may be arranged to control the phase-locked loop to operate in its first mode when the transmitter is operating in its first mode and to control the phase-locked loop to operate in its second mode when the transmitter is operating in its second mode. Alternatively, the transmitter could not transmit when in the second mode.

The first protocol may be Bluetooth. The second protocol may be GPS.

The present invention will now be described by way of example with reference to the accompanying drawings. In the drawings.

Figure 1:
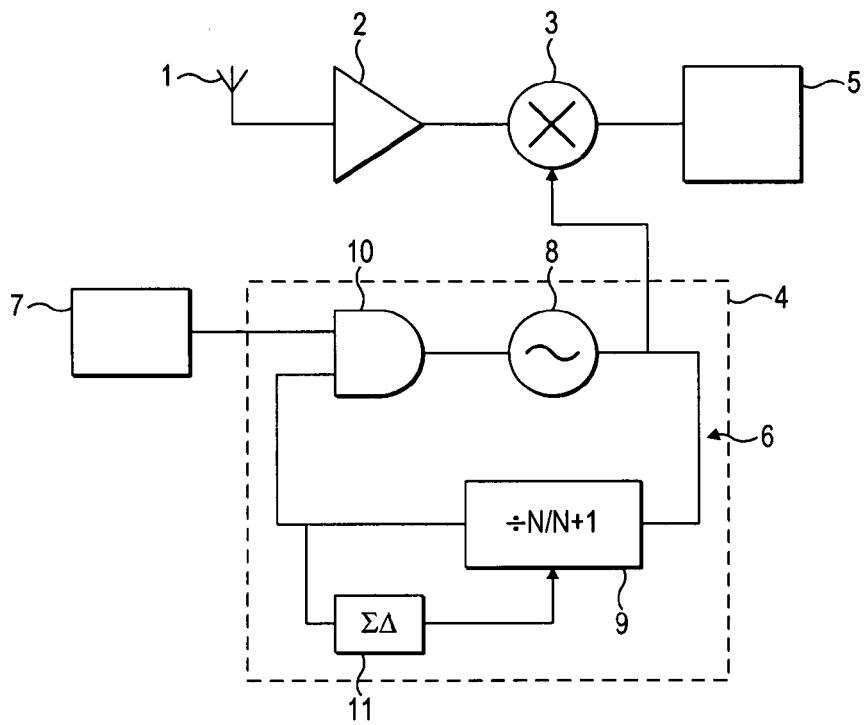
FIG. 1 is a schematic diagram of a GPS receiver.
Figure 2:
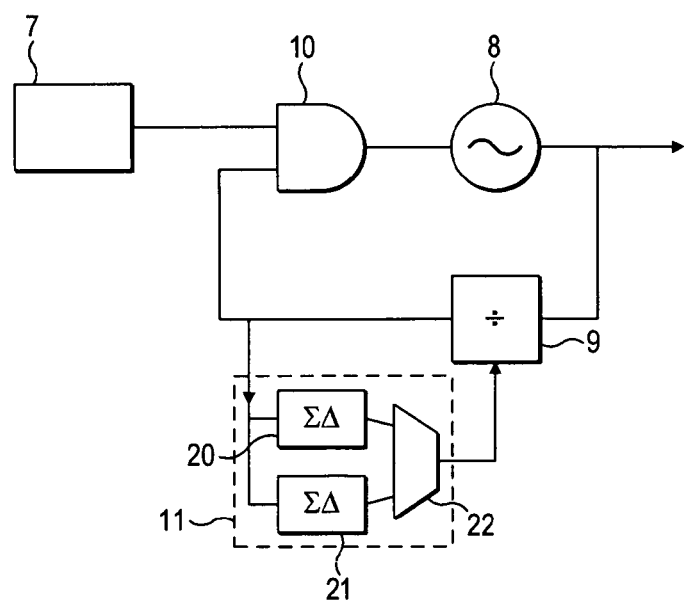
FIG. 2 is a schematic diagram of a phase-locked loop.
Figure 3:
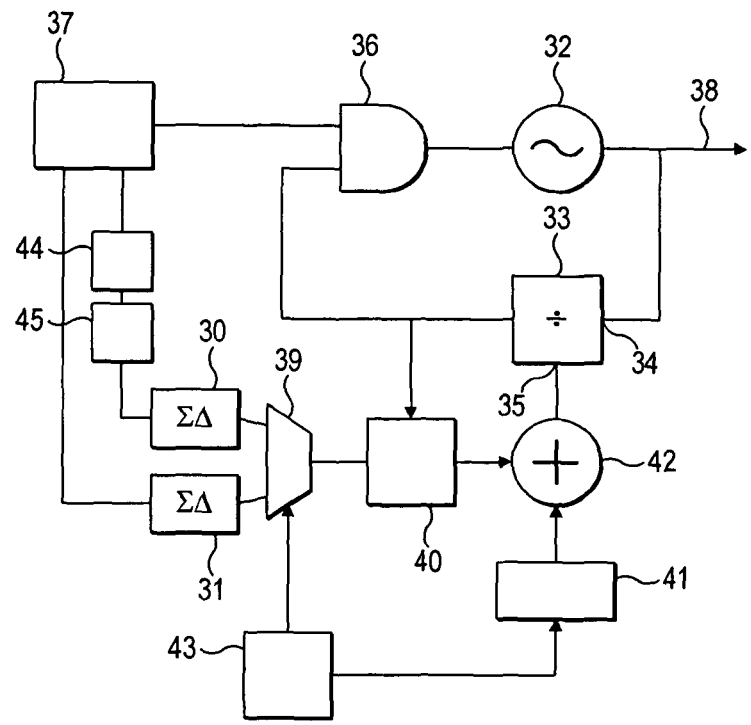
FIG. 3 is a schematic diagram of an alternative design of phase-locked loop.

The PLL of FIG. 3 is similar to that of FIG. 2 in that it has two sigma-delta modulators 30, 31 each of which is configured to produce a sequence of codes that is appropriate for a respective mode of operation. In FIG. 3 the sigma-delta modulators are clocked independently of the PLL frequency, so that each one may retain its correct state when the PLL is being controlled from the other sigma-delta modulator. Keeping the sigma-delta modulator running independently of the PLL allows the state of the PLL to be, in effect, maintained without the need for the PLL to be running. This allows power to be saved. When the sigma-delta modulator is re-connected to the PLL the state is restored.

The PLL of figure is a fractional-N PLL. It comprises a controllable oscillator 32. In this example the oscillator 32 is a VCO, but oscillators that are controlled by means other than voltage could be used so as to accommodate different forms of output that may be provided by the phase comparator in a particular implementation. The output from the oscillator provides the output 38 from the PLL. In this example that output is used for downconverting received radio signals but other uses are possible and will be discussed in more detail below.

The output of the oscillator is applied to the input of frequency divider 33. Divider 33 divides the signal supplied by the oscillator at its first input 34 by a divisor value supplied in digital form to its second input 35.

The output of the divider 33 passes to phase detector 36. The phase detector also receives a signal from a reference clock 37, which could optionally be considered to be part of the PLL. More conveniently, the reference clock could be the reference clock for the whole device of which the PLL forms part. The reference clock could be a crystal oscillator or could simply be a pin that receives a clock from a remote source. The phase detector detects the difference in phase between the signal from the divider and the signal from the reference clock and outputs a voltage that is dependent on that difference. The voltage is such as to cause the VCO 32 to run at a rate that brings the VCO into lock with the reference clock. Phase detectors of that type are well known in PLL design.

The divisor value is supplied at 35 by means of sigma-delta modulators 30, 31, a multiplexer 39, a sample-and-hold unit 40, a memory 41 and an adder 42. The multiplexer 39 and the memory 41 operate under the control of a mode control unit 43. The mode control unit configures the PLL to operate either for supplying a local oscillator signal for use in receiving GPS signals or for supplying a local oscillator signal for use in receiving Bluetooth signals. In GPS mode the control unit sets multiplexer 39 to pass the output of sigma-delta modulator 30 to sample-and-hold unit 40 and causes memory 41 to output a first value $M_1$ that is pre-stored in the memory. In Bluetooth mode the control unit sets multiplexer 39 to pass the output of sigma-delta modulator 31 to sample-and-hold unit 40 and causes memory 41 to output a second value $M_2$ that is also pre-stored in the memory. Other values could be pre-stored in the memory for use in other modes. The values are selected in view of the reference frequency so that the output signal at 38 has the desired frequency.

In each mode the divisor value is formed as follows. The sample-and-hold unit 40 is clocked from the PLL loop at the output of the divider. When it is clocked it stores the value that is currently being output by whichever of the sigma-delta modulators 30, 31 is connected to it by the multiplexer 39. That value is added by the adder 42 to the value that is being output by memory 41 and the sum of those two values is the divisor value that is supplied at 35 to the divider 33.

Each of the sigma-delta modulators 30, 31 is configured for supplying a stream of values that will control the divider in an appropriate way for receiving signals of the respective protocol. In this example each sigma-delta modulator outputs a value signifying −1, 0 or +1. Those values could be output in conventional binary form, but more preferably they are output in Gray-coded form. For example, 01 could represent −1, 00 could represent 0 and 10 could represent +1. The Gray-coded values could be interpreted in the desired way by adder 42 operating as shown below for the example of GPS reception:

| Output of sample-and-hold unit 40 | Output of adder 42 |
|---|---|
| 01 | $M_1 - 1$ |
| 00 | $M_1$ |
| 10 | $M_1 + 1$ |

In this example there are three available values for the divisor. In other implementations there could be two available values or more than three. The available values are preferably all adjacent integers, and each is preferably spaced from the nearest other available values by 1, as in the example above.

The sample-and-hold unit could be implemented by means of one or more flip-flops, one for each bit in whichever of the sigma-delta outputs is the wider.

The use of the memory 41 and adder 42 is convenient because it allows the sigma-delta modulators to be simplified and allows there to be fewer bit channels in the multiplexer and the sample-and-hold unit. However, the sigma-delta modulators could be configured to output a series of values that already include the appropriate $M_1$ or $M_2$ value, in which case the memory 41 and the adder 42 can be omitted. For example, instead of outputting 01, 00 or 10 as in the example above, sigma-delta modulator 30 could output $(M_1-1)$, $M_1$, or $(M_1+1)$. In an implementation of that type it may be convenient to implement the modulator in such a way that its output can take more values than the allowable output values. Invalid values could be stripped out by an intermediate filtering step after the output of the sigma-delta modulator.

The sigma-delta modulators 30 and 31 are clocked independently of the frequency at which the PLL loop is currently operating. Each one could, for example be clocked from the reference clock 37, either directly or via a phase shifter (e.g. a delay line 44) and/or a frequency divider or multiplier 45. This has the advantage that the state of each sigma-delta modulator is not affected when the rate of the PLL changes. This implementation has a significant advantage over the implementation of FIG. 2. In this implementation the modulation state of the PLL can be maintained irrespective of which mode the PLL is operating in, so that coherent PS correlation to a received signal can be achieved when GPS mode is activated. In the circuit of FIG. 2, this is done without the need to implement two PLLs. This is possible because the state of the PLL is essentially defined by the state of the sigma-delta modulator and not by the other components of the loop. Thus, an advantage of clocking the sigma-delta modulator from the reference clock arises from the possibility that when a switch is made between modes, for example from GPS to Bluetooth, or vice versa, the clock train of the feedback loop is disturbed and is temporarily not equivalent to the reference clock. If the feedback clock were to drift by one cycle during the switch period then the state would be lost. Clocking the sigma-delta modulator from the reference clock avoids the risk that the state might be lost in that way.

When the receiver is in operation it can switch between Bluetooth and GPS operation. Whichever mode it is operating in, both of the sigma-delta modulators 30 and 31 continue to be clocked. They continue to change state at the same rate when they are being used to influence the PLL as when they are not. This means that when either sigma-delta modulator is switched into service by multiplexer 39 the PLL returns rapidly to the same state as it would have had if that sigma-delta modulator had not been switched out. Where the PLL is being used in a receiver in the manner described above, this has the advantage that when a sigma-delta modulator is switched back in after a break the receiver is quickly put back into operation with the same phase as it would have had if that sigma-delta modulator's influence over the PLL had not been interrupted.

In the circuit of FIG. 3 the divisor value applied to the divider circuit is dependent on the content of the sample-and-hold circuit at the time that the addition takes place, not on the output of the active sigma-delta modulator at the time that the addition takes place. Because the sample-and-hold unit 40 is clocked differently from the sigma-delta modulators the synchronisation of the modulator output to the loop is not perfect. It is possible that between the time that the sample-and-hold circuit samples the output of the active sigma-delta modulator and the time when the addition takes place the output of the sigma-delta modulator could change. If that happens then the divisor value will be different in the circuit of FIG. 3 than it would be in a circuit where the sigma-delta modulator was clocked from the PLL. This is potentially a source of error which could result in a longer time to lock. Ideally, therefore, the sigma-delta modulators should be maintained in such a way that this error cannot accumulate to the stage where the PLL is unable to lock when either sigma-delta modulator is switched in. However, it has been found through simulations that if the sigma-delta modulator is maintained in such a way that the error is minimised, ideally to less than 1 then the PLL always locks and that the lock time is only marginally affected by the hypothetical error occurring during lock. One way to achieve this is by limiting the output of the sigma-delta modulator to the values −1, 0, +1 (or equivalents)

As indicated above, it is preferred that when it is desired to operate the system in such a way that either mode may be used at any time, both sigma-delta modulators are clocked continuously and independently of the PLL. This de-correlation of the PLL and the sigma-delta modulators allows each sigma-delta modulator to maintain its state independently of whether it is influencing the PLL or not.

Instead of sigma-delta modulators other devices could be used to provide the modulation signals that determine which of the available divisor values is to be used. One alternative is a pulse-width modulator. Another is a state machine that cycles between a set of stored output states. In each case, the state of the selected device should continue to run when it is not active, and the rate that it runs at whether active or not should not be dependent on the rate of the PLL.

Figure 4:
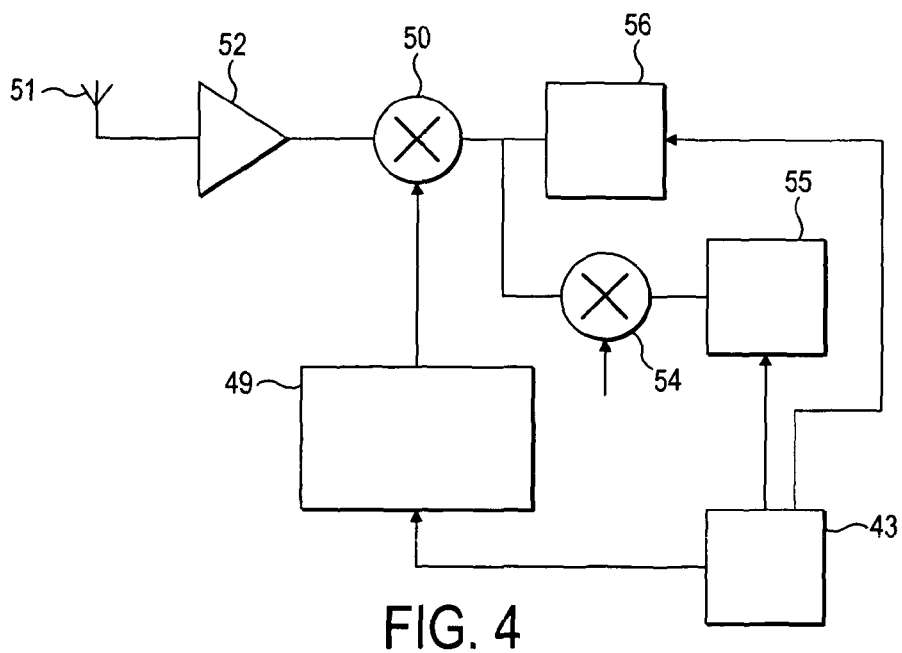
FIG. 4 illustrates the PLL of FIG. 3 in use in a receiver.

FIG. 4 illustrates one way in which the PLL of FIG. 3 (shown as 49 in FIG. 4) could be used. The PLL could provide its output to a mixer 50 which downconverts radio signals received from antenna 51 and amplified by amplifier 52. The resulting signal can be processed in accordance with the protocol that is in use. For instance, if the signals are GPS signals they could be de-spread in a second mixer 54 and then processed by a GPS processor 55. If the signals are Bluetooth signals they could pass directly for processing by a Bluetooth processor 56. The appropriate processor 55 or 56 could be activated under the control of the mode control unit 43, depending on which mode the device is to operate in. The output of the PLL could pass via a frequency multiplier or divider to the mixer. The multiplier or divider could be switched in or out, or could apply a different multiplication/ division value in each mode.

The principles described above can be used in other situations. They could be used for receivers that need the ability to switch between protocols other than Bluetooth and GPS, and/or between more than two protocols. They could be used for PLLs that control the frequencies of signals that are used in transmitting rather than (or in addition to) receiving. Any protocols could substitute for Bluetooth and GPS, but advantageously another protocol in which transmissions occur in bursts could substitute for Bluetooth. Another locationing protocol such as Galileo could substitute for GPS.

The principles described above could be used in hard disc drive controllers to maintain lock on multiple bitstreams from different parts of the disc that are read at different frequencies.

The principles described above could be used in RADAR transceivers and in other metrology applications where it is desired to transmit and receive at desired frequency and phase relationships. In such application one sigma-delta modulator could be used for transmission and the other for reception, or one could be used for transmission and/or reception with one frequency and one with another. In general, the principles could be used in any application where a PLL has to switch between multiple states but has return to a state with the phase and/or frequency that it would have if it had never left that state.

In situations where a GPS receiver has sufficiently good signal reception it may be able to maintain a positional fix even if it is only receiving signals for 25% or less of the time. The principles described above could be applied to GPS receivers that are not able to receive Bluetooth. The GPS receiving circuitry could be deactivated for a selected period of time so as to save power, but the sigma-delta modulator could continue to be clocked when reception is not taking place so that the receiver maintains coherency with the GPS signals with the result that when reception is re-activated the receiver can rapidly lock. Similar principles could be used for other systems that demand coherent reception.

The PLL could be implemented on a single integrated circuit (IC). The IC could incorporate the PLL loop and the modulators and the mode control circuitry. Alternatively the components could be implemented on multiple integrated circuits or with discrete components. Where the PLL is used to provide input to a receiver, the receiver may be implemented on the same IC as the PLL and the modulators.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A phase-locked loop having:
an oscillator for forming an oscillating output signal;
a frequency divider connected to receive the output of the oscillator and frequency divide it by a value dependent on a division control signal; and
a phase comparator for comparing the phase of the divided signal and a reference signal to generate a control signal, the operation of the oscillator being dependent on the control signal;
a first mode of operation in which the frequency divider is configured to operate in dependence on a first division control signal such that the resultant oscillating output signal has a first frequency and first phase,
a second mode of operation in which the frequency divider is configured to operate in dependence on a second division control signal such that the resultant oscillating output signal has a second frequency and second phase different from the first frequency and first phase,
the first division control signal being generated independently of the oscillating output signal such that, when the phase-locked loop is operating in the second mode, the first division control signal remains operative to produce the same phase as when the phase-locked loop is operating in the first mode.

2. The phase-locked loop of claim 1, wherein the second division control signal is generated independently of the oscillating output signal such that the first phase is maintained when the phase-locked loop is operating in a second mode.

3. The phase-locked loop of claim 1, wherein the first division control signal and the second division control signal are generated by a division ratio controller.

4. The phase-locked loop of claim 3, wherein the division ratio controller is a sigma-delta modulator.

5. The phase-locked loop of claim 3, wherein the frequency divider is operable to frequency divide the output of the oscillator by the output of the division ratio controller.

6. The phase-locked loop of claim 3, wherein the frequency divider is operable to frequency divide the output of the oscillator by the output of the division ratio controller plus a predetermined constant.

7. The phase-locked loop of claim 3, wherein the division ratio controller is configured to output only integers.

8. The phase-locked loop of claim 3, wherein the division ratio controller is configured to output only values from a set whose members that differ by two or less.

9. The phase-locked loop of claim 6, wherein the division ratio controller is configured to output only the values −1, 0 and −1.

10. The phase-locked loop of claim 3, wherein the division ratio controller is configured to output values in Gray coded form.

11. The phase-locked loop of claim 3, comprising a sample-and-hold circuit arranged to store the most recent output of the division ratio controller, the frequency divider being configured to frequency divide the output of the oscillator by the value stored by the sample-and-hold circuit.

12. The phase-locked loop of claim 3, comprising a second division ratio controller configured to, when clocked by an input signal, generate a series of output data for forming the division control signal; the phase-locked loop being arranged to, when operating in the second mode of operation frequency divide the output of the oscillator by a value dependent on the output of the second division ratio controller.

13. The phase-locked loop of claim 12, the phase-locked loop being arranged so that, when operating in the first mode of operation, the second division ratio controller is clocked by a signal that is independent of the output of the oscillator.

14. The phase-locked loop of claim 1, wherein the phase-locked loop is a fractional N phase-locked loop.

15. A signal receiver comprising:
a phase-locked loop as claimed in claim 1; and
a downconverter for downconverting a received signal in dependence on the output of the oscillator.

16. The signal receiver of claim 15, wherein the downconverter comprises a mixer configured to mix a received signal with a signal whose frequency is dependent on the output of the oscillator.

17. The signal receiver of claim 15, the receiver having a first mode for receiving signals of a first protocol and a second mode for receiving signals of a second protocol, and being arranged to control the phase-locked loop to operate in its first mode when the receiver is operating in its first mode and to control the phase-locked loop to operate in its second mode when the receiver is operating in its second mode.

18. A signal transmitter comprising:
a phase-locked loop as claimed in claim 1; and
an upconverter for upconverting a signal for transmission in dependence on the output of the oscillator.

19. The signal transmitter of claim 18, wherein the upconverter comprises a mixer configured to mix a signal for transmission with a signal whose frequency is dependent on the output of the oscillator.

20. The signal transmitter of claim 18, the transmitter having a first mode for transmitting signals of a first protocol and a second mode for transmitting signals of a second protocol, and being arranged to control the phase-locked loop to operate in its first mode when the transmitter is operating in its first mode and to control the phase-locked loop to operate in its second mode when the transmitter is operating in its second mode.

* * * * *